INVENTORS
COURTLAND M. HENDERSON
EMIL R. BEAVER, JR.
BY
Herman O. Bauermeister
Attorney INVENTORS
COURTLAND M. HENDERSON
EMIL R. BEAVER, JR.
BY Herman O. Bauermeister
Attorney United States Patent Office 3,285,019
Patented Nov. 15, 1966

3,285,019

TWO-PHASE THERMOELECTRIC BODY COMPRISING A LEAD-TELLURIUM MATRIX

Courtland M. Henderson, Xenia, and Emil R. Beaver, Jr., Tipp City, Ohio, assignors to Monsanto Company Filed May 27, 1963, Ser. No. 283,197
13 Claims. (Cl. 62—3)

Figure 1:
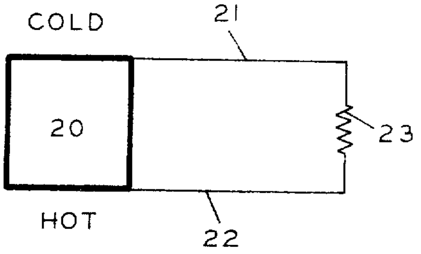

This application is a continuation-in-part of copending applications Serial Nos. 169,501; 169,283; 169,536; 169,395; 169,209; 169,210; 169,579; all filed January 29, 1962.

The present invention relates to thermoelectricity, novel thermoelectric materials and elements thereof and processes for their manufacture. It is an object of the invention to provide greatly improved thermoelectric combinations relative to presently known materials and devices. It is also an object of the invention to manufacture these novel thermoelectric elements and devices by improved processes in order to control thermoelectric and lattice strain properties thereof. It is an object of the invention to produce conditions of proper matrix strain that will retain their valuable thermoelectric properties when the thermoelectric material is used at elevated temperatures such as produced at the hot ends of heating-cooling and power generating units.

It is a further object of the invention to provide a method for producing said thermoelectric materials in a form which will provide either for the conversion of heat into electricity or the removal of heat by electricity at efficiencies significantly greater than are presently possible with currently available thermoelectric materials and devices.

One of the greatest obstacles preventing the more widespread commercialization of thermoelectric devices is the lack of materials of sufficient effectiveness, i.e., having sufficiently high merit factors to yield cooling, heating and power generating devices of thermal efficiencies high enough to make them economically competitive with their conventional mechanical counterparts. The relation of thermoelectric parameters to Z, a merit factor of importance for heating, cooling and power generation applications, is shown below $$Z=S^2/\rho K$$

where

S=the Seebeck coefficient,
$\rho$=electrical resistivity, and
K=thermal conductivity The higher the Z factor, the greater is the amount of refrigeration, heating or power generation that can be obtained from a thermoelectric material for a given energy throughput. The lower the product of the resistivity and the thermal conductivity, the higher the merit factor, when the Seebeck coefficient remains constant.

As is well recognized by those skilled in this art, thermoelectric materials have not yet been produced that will simultaneously exhibit high Seebeck coefficients, low electrical resistivities and low thermal conductivities to yield high enough merit factors and efficiencies to make devices based on thermoelectricity economically competitive with conventional power generating and cooling devices.

Various routes have been followed in an attempt to overcome this obstacle. For example, attempts have been made to increase the merit factors of materials by decreasing the product of the resistivity and thermal conductivity through increasing the mobility of the carriers (e.g., electrons and/or holes) relative to the thermal conductivity of thermoelectric materials through the use of materials composed of atoms having large atomic weights.

Another popular approach has been to produce alloy type thermoelectric materials in which a homogeneous distribution of constituents in the alloy is obtained by solid solution, so as to decrease the product of the resistivity and the thermal conductivity of thermoelectric materials. This solid solution or alloy approach has resulted in less than a 10% increase in the Z merit factor for a given thermoelectric material and such materials exhibit poor mechanical properties. More important, the beneficial effect of the homogeneous distribution obtained by the alloy approach is lost after a short time when such thermoelectric materials are used at elevated, but normal operating hot end temperatures.

Another approach has been to form physical voids or holes in a given thermoelectric material. While some slight increase in the Seebeck coefficient occasionally results from this approach, improvement in the merit factor possible through this means is usually less than 5%. The presence of voids (filled with a vacuum, air or other gas) has reduced the strength and other mechanical properties of thermoelectric materials so that serious reductions in the life and performance of devices made from such materials more than offset the small gains in the efficiency obtained. In addition, it has been impractical to adequately control the concentration and placement of the voids to obtain the best results. Prior art has held that the presence of insoluble inclusions in the thermoelectric materials is detrimental to obtaining high Z factors.

Still another approach has been to improve the merit factors of thermoelectric materials by introducing strain into their solid state lattice structure. Such lattice strain is usually accomplished by placing the material under high stress during fabrication or by a combination of precipitating a small particle phase simultaneously with stressing the lattice during fabrication. This approach results in only a temporary improvement in power generation and cooling-heating characteristics of such materials since the precipitate phases are redissolved and the lattice strain lost when they are exposed to elevated temperatures, such as found at the hot ends of any thermoelectric units.

The above problems are overcome and significant increases in the merit factor of thermoelectric materials is possible through the teachings of this invention. This invention follows an opposite approach from prior art teachings in that stable elements, compounds or combinations of elements and compounds of the groups listed below are dispersed within the thermoelectric matrix of this invention.

*Elements.*—Carbon (cubic and hexagonal forms (manganese, tungsten, tantalum, columbium, platinum, iron, nickel, cobalt, iridium, osmium, rhenium, chromium, molybednum, beryllium, vanadium, and rare earths of the lanthanide and actinide series;
*Oxides of*—Magnesium, aluminum, zirconium, beryllium, chromium, hafnium, vanadium;
*Nitrides of*—Boron, hafnium, rare earth elements of lanthanide and actinide series;
*Sulphides of*—Rare earth elements of lanthanide and actinide series;
*Phosphides of*—Boron and aluminum;
*Carbides of*—Boron, silicon, magnesium and titanium;
*Silicides of*—Carbon
*Fluorides of*—Calcium, magnesium and sodium
*Chlorides of*—Sodium and potassium.

The present invention is based upon the use of a specific group of the above elements, sulfides, oxides, carbides, nitrides, silicides, phosphides, fluorides and chlorides, namely, those which have particular ranges of values for their arithmetic deviation in percent of cubic thermal expansion from that of the matrix. The dispersants of the present class are those having a percentage of cubic thermal expansion, up to 500° C., which deviates from that of the matrix by sufficient degree to make the differential thermal expansion of the dispersant (relative to that of the matrix) cause strains to be set up in both materials due to nonlinear expansion and contraction with changes in temperatures. These ranges lie within the cross-hatched areas established in FIGURE 7 relative to the percent cubic thermal expansion of the matrix shown as the central horizontal axis represented as a temperature scale increasing to the right. These ranges include dispersant materials whose percentage of cubic thermal expansion deviates arithmetically from that of the particular matrix by a deviation of from 0.50% to 2.00% over the temperature range of from 0° C. to 500° C. A more preferred range is 0.58% to 2.00% deviation, while the most preferred range is from 0.67% to 2.00% deviation.

The percentage of cubic thermal expansion referred to above is defined as the difference in volume of a dispersant material over a temperature range from 0° C. to a given higher temperature, (e.g., 500° C.) divided by the volume of material at 0° C. and multiplied by 100. This range broadly includes materials that expand or contract volumetrically with temperature, within the limits of elasticity of the dispersant and the matrix.

As an example of the use of the above criteria the 50 mole percent Pb-50 mole percent Te composition, having an approximate 2.46% cubic thermal expansion over a 0–500° C. range, is modified with about 1 mole percent $CaF_2$ dispersant having an approximate 3.48% cubic thermal expansion over a 0–500° C. range. The deviation of the expansion of the dispersant from that of the matrix is 1.02. This 1.02% falls in the 0.67% to 2.00% deviation range specified, with the resulting stresses on matrices and dispersants being well under their elastic limits. Thus, by thermal expansion criteria, calcium fluoride is considered to be a useful dispersant of the present invention.

Figure 4:
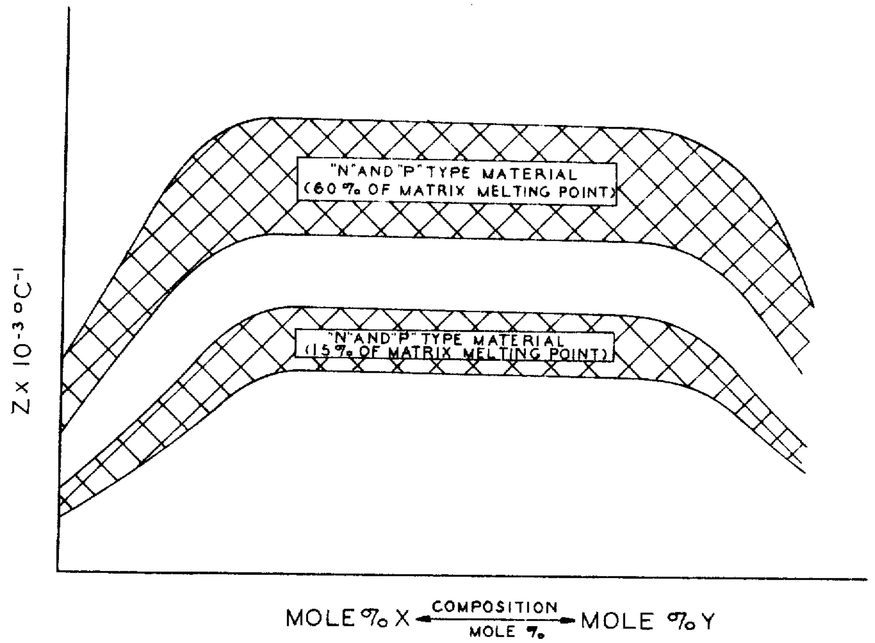

7 Matrices of semiconductors or thermoelectric materials of this invention, within which the above group of dispersants are distributed consist, as shown in FIGURE 4, of various combinations of lead and tellurium or selenium in the range between 43 mole percent lead and 57 mole percent tellurium or selenium to 54 mole percent lead and 46 mole percent tellurium or selenium doped with various elements and combinations thereof to yield n and p type thermoelectric materials capable of long-life at elevated temperautres. Dopants are distinguished from dispersants in that dopants are quite soluble, e.g., more than 10 mole percent at 60% of the absolute melting point temperature of the matrix, while dispersants are less than this figure.

It is noted that the dispersants are always present as insoluble phases, throughout the above ranges of concentration, since their solubility and chemical reactivity with the matrix are always less than the 10% limit expressed above.

The lead-tellurium combinations exist as stoichiometric and non-stoichiometric compounds and solutions containing small or large proportions of the excess element. Such excess does not function as a dispersant of the type described above.

The materials of this invention are to be distinguished from nonstoichiometric compounds or solid solutions of conventional semiconductor or thermoelectric materials. Further, they are to be distinguished from the impurity compounds and randomly dispersed inclusion resulting from the reaction of the matrices of conventional semiconductor or thermoelectric materials with their environments, such as oxygen, during processing. The size, spacing and concentration of the dispersants of this invention in lead-tellurium matrices permit significantly greater variations and control of the relation between its electrical resistivity and thermal conductivity and to some extent the Seebeck coefficient than has been possible with prior art practices. This is done by causing the additive particles, which are substantially insoluble in the matrix materials, to be placed close enough to each other so as to affect the lattice structure of the matrix materials by inducing strain. This impedes the flow of thermal energy, as by phonons, more than the flow of electrical charge carriers (electrons holes, ions and other). Dispersion of such additive particles usually has a beneficial effect on the Seebeck coefficient, but the main result is to permit a long-life net decrease in the product of the resistivity and the thermal conductivity with a correspondingly long life increase in the merit factor for the aforesaid thermoelectric materials.

From the view point of optimizing device performance it is also desirable to provide semiconductor or thermoelectric materials in which the resistivity and thermal conductivity can be controllably varied along energy flow paths. Ability to vary and control the thermoelectric parameters such as the Seebeck coefficient, electrical resistivity and thermal conductivity for both p and n type materials, through use of additives or dispersants as prescribed herein produces significant and more permanent merit factor increases for the modified thermoelectric materials as compared with unmodified ones. In addition, the dispersion of the presently characterized small strong particles or nuclei through the matrix of semiconductor or thermoelectric materials minimizes harmful recrystallization and adds to strength properties. For example, when semiconductor materials are to be used at temperatures high enough to cause their destruction by oxidation, presence of the dispersed refractory materials in the matrix thermoelectric material improves their resistance to such attack. Further the presence of these dispersed particles enhances the bonding of ceramic type coatings, as well as the bonding of electrical and thermal leads to the thermoelectric element, since it is often possible to more readily join an oxide or refractory protective coating or heat-resistant electrical and thermal leads to the improved matrix thermoelectric materials by sintering the protective coating or lead elements to the surface of the matrix material where the dispersed particles are present. For example, it is found that alumina dispersed in a matrix of lead-tellurium greatly improves the bonding of a protective high temperature coating of glass to the matrix material.

Figure 2:
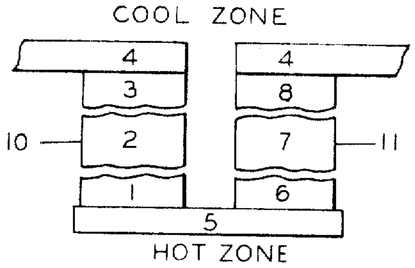
Figure 3:
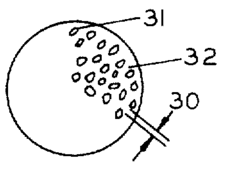
Figure 7:
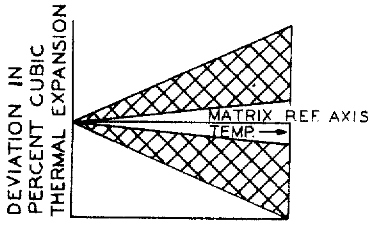
Figure 6:
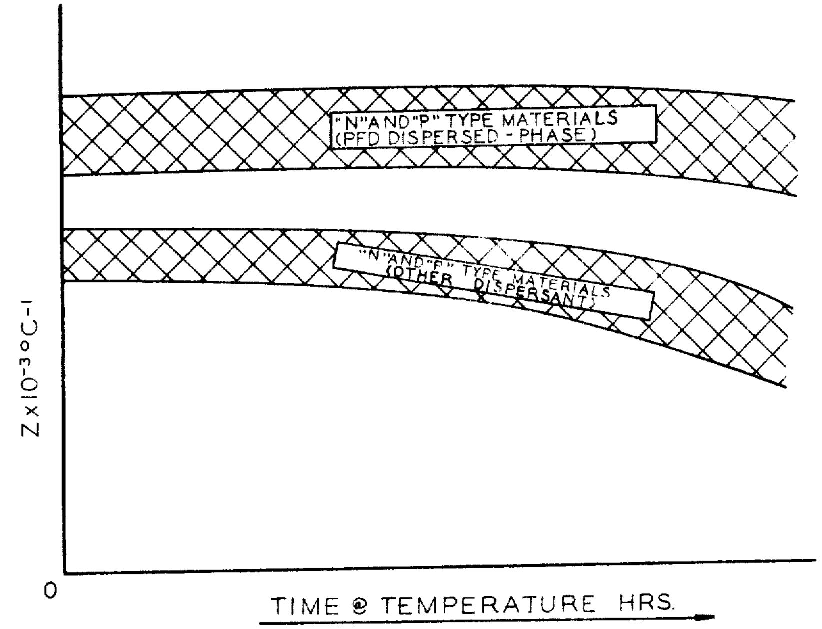
Figure 5:
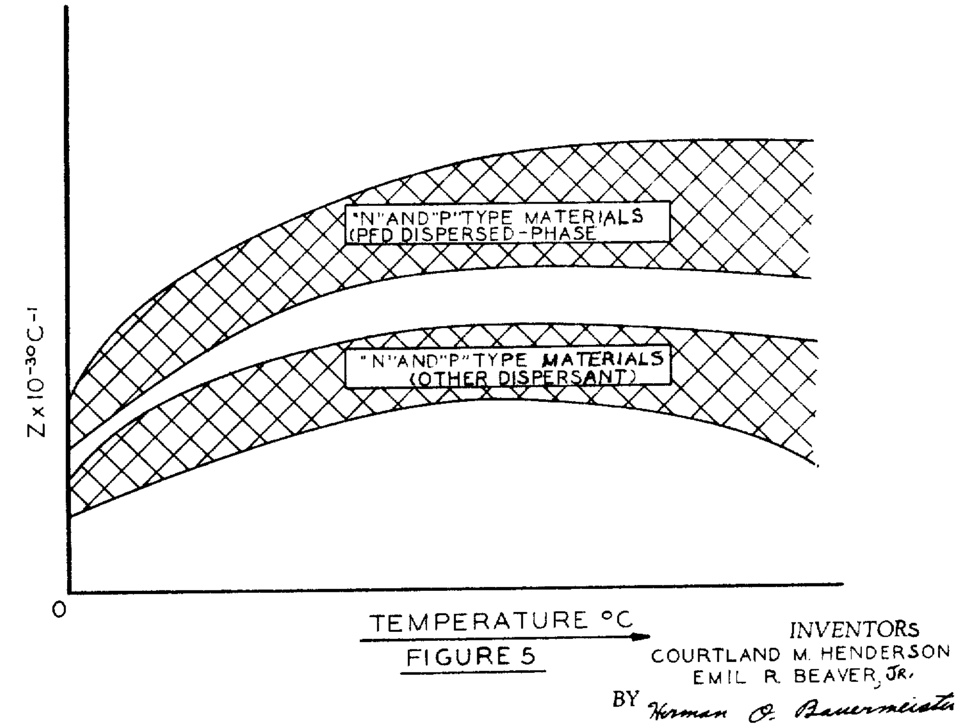

The drawings of the present invention illustrate specific devices for the present invention, and the use thereof for interconverting heat and electrical energy, e.g., by applying one of the aforesaid forms of energy and withdrawing the other of the aforesaid forms of energy from opposed regions of a shaped body of the present modified thermoelectric materials. FIGURE 1, presents a typical cooling, heating or power generating circuit in which units of the present invention are useful. FIGURE 2 shows a typical cooling-heating or power generating type unit in which elements made of the dispersed particle thermoelectric materials of this invention are demonstrated. FIGURE 3 shows the details of the microstructure of the compacted thermoelectric element made from the materials of this invention. FIGURE 4 presents plots of typical merit factors at two temperature ranges for various lead-tellurium compositions of this invention. FIGURE 5 presents a comparison over a range of temperatures of the merit factors of p and n type lead-tellurium with dispersants of similar and more widely deviating expansion characteristics. FIGURE 6 shows that the merit factor of typical p and n type lead-tellurium materials with dispersants of similar expansion characteristics decrease more rapidly with time, under high temperature power generating and cooling conditions, than the merit factors of the same composition matrix modified by the teachings of this invention. FIGURE 7 shows the critical relationship of the percent cubic thermal expansion of the dispersant and the matrix.

This invention includes a process for manufacturing thermoelectric elements of improved merit factors by using refractory phases which have different coefficients of expansion than the matrix materials in which they are dispersed. This practice is most useful for power generating and high temperature heating-cooling devices in which the thermoelectric material is to be heated to high operating temperatures.

The induction of stress or strain into the matrix thermoelectric material lattice offers an additional means of preferentially causing the thermal conductivity of such matrix materials to decrease more than the resistivity increases, since the flow of heat by phonons can be preferentially impeded more than the flow of charge carriers (electrons, ions, and holes). The dispersed particles serve to lock or retain for significantly longer periods (as compared with prior art) of time, the desired degree of strain within the matrix lattice by preventing or greatly retarding the flow of dislocations that would release such strain, or stress, within the lattice.

The composition of matter by this invention is obtained by controlling the composition to contain broadly from 0.001 mole percent to 29 mole percent of at least one small particle refractory phase that is homogeneously dispersed through a matrix of lead-tellurium thermoelectric material, the balance of the composition substantially being made up of the matrix material. A more preferred composition contains from 0.01 mole percent to 20 mole percent of at least one small particle refractory phase dispersed in a matrix of thermoelectric material. The most preferred composition contains from 0.1 mole percent to 15 mole percent of the small particle refractory phases dispersed through a matrix of the thermoelectric material. In general, the dispersed phase, less than 10 mole percent soluble at 60% of the absolute melting point temperature of the matrix, is substantially insoluble in the matrix material deviates within prescribed limits in coefficient of thermal expansion and otherwise meets the criteria that the melting point (absolute temperature) of the refractory phase should exceed the melting point (absolute temperature) of the matrix material in which they are dispersed, by a factor of 5%, e.g., the dispersant has an absolute melting point of at least 105%, that of the matrix.

More preferably, the melting point of the dispersed phase should exceed the melting point of the matrix material by 10%. Most preferably, the absolute melting point of the refractory dispersed phase should exceed that for the matrix by 15%, or more. Broadly, the size of the particles of the dispersed stage should be larger than 50 A., but not exceed 500,000 A., with preferred sizes ranging from 100 A. to 400,00 A. and most preferably between 200 A. to 350,000 A. Useful interparticle distance between particles of nuclei range from 50 A. to 500,000 A. A more preferred interparticle spacing of the dispersed particles in the matrix ranges from 100 A. to about 350,000 A., with the most preferred interparticle spacing for optimum properties ranging from 200 A. to less than 200,000 A.

IN FIGURE 4, the composition of the lead-tellurium matrix (exclusive of dopants) of the thermoelectric material in which the small particles are dispersed, is broadly defined to range from 43 mole percent lead (X component of FIGURE 4) and 57 mole precent tellurium (Y component of FIGURE 4) to 54 mole percent lead with 46 mole percent tellurium. A more preferred range of matrix composition is between 45 mole percent lead with 55 mole percent tellurium and 53 mole percent lead with 47 mole percent tellurium. A most preferred range of matrix composition is between 47 mole percent lead with 53 mole percent tellurium and 52 mole percent lead with 48 mole percent tellurium. The present thermoelectric compositions also include bismuth, germanium, antimony and silver-antimony substituted for lead in the above stoichiometric and non-stoihciometric compositions, with antimony and selenium substituted wholly and partially for tellurium; e.g., matrices of Bi-Te, Bi-Sb, Sb-Te and Sb-Se as compositions as well as various other compositions such as Bi-Te-Se and Pb-Te-Se, Bi-Te-Sb, Ag-Sb-Te. Preferred examples are Bi-Te-Sb, Bi-Sb, Pb-Te and Pb-Se. Lead-tellurium examples are generally used here to demonstrate the teachings of this invention.

For *p* type lead-tellurium, dopants such as sodium, potassium and excess tellurium in the range of $1\times10^{-10}$ mole percent to 5 mole percent of the thermoelectric matrix are used. For n type lead-tellurium, dopants such as aluminum, titanium, gallium, zirconium and excess lead in the range of $1\times10^{-10}$ mole percent to 5 mole percent of the thermoelectric matrix are useful.

In the folowing examples the shaped bodies of the various thermoelectric compositions are formed by consolidating the particulate components; the thermoelectric units are then made by attaching leads, after which measurements are made to determine the merit factor Z with respect to cooling and power generating characteristics. The specific, preferred dispersants used prevent recrystallization at high temperatures.

The following examples illustrate specific embodiments of the present invention and show various comparisons against prior art compositions and materials.

*Example 1*

As a specific example of typical results obtainable through the teachings of this invention in producing superior high temperature power generating materials and devices, 3 mole percent of boron nitride consisting of particles ranging is size from 100 A. to 10,0000 A. is homogeneously distributed through a lead (50 mole percent-tellurium (50 mole percent p type matrix doped with 0.14 mole percent of sodium so that the approximate average interparticle spacing between the boron nitride particles in this doped matrix is 280 A. after compacting at 700° C. and 5000 p.s.i. The Z factor of a magnesoum oxide modified lead (50 mole percent-tellurium (50 mole percent matrix material is $1.2\times10^{-3}/°$ C. at about 300° C. The Z factor for the modified lead-tellurium matrix with dispersed boron nitride is $3.0\times10^{-3}/°$ C. at about 300° C. or about 250 percent higher than the Z factor for the magnesium oxide modified specimen of the same composition for the same operating temperatures as indicated in FIGURE 4. The merit factor for a complementary n type lead (50 mole percent-tellurium (50 mole percent doped with 0.1 mole percent aluminum is similarly increased from $1.3\times10^{-3}/°$ C. (magnesium oxide modified) to $3.1\times10^{-3}/°$ C. by fabricating elements in which 4 mole percent of the same size boron nitride particles are homogeneously dispersed The percent cubic expansion and arithmetic deviation (0° C. to 300° C. range) between the matrix and dispersant are shown below together with the corresponding merit factor (n and p type materials).

| | Percent at 300° C. | Deviation, percent | $Z\times10^{-3}$ |
|---|---|---|---|
| Pb-Te | 1.41 | 0 | |
| BN | 0.63 | 0.78 | n=3.1<br>p=3.0 |
| MgO | 1.32 | 0.09 | n=1.3<br>p=1.2 |

*Example 2*

A specific example of typical resuts obtained when a conventional high temperature heating-cooling thermoelectric material is modified by the teaching of this invention is shown when a p type lead (50 mole percent) tellurium (50 mole percent) matrix doped with 0.07 mole percent potassium modified by having dispersed within it 6 mole percent of calcium fluoride. Particle size of the calcium fluoride additive ranges in size from 150 A. to 200,000 A. This composition is compacted at 650° C. under 10,000 p.s.i. The resulting compacts show interparticle spacings between the additive dispersant particles varying from 200 A. to 350,000 A. The Z factor of a doped, iron silicide modified p type matrix processed in the same die under the temperature-pressure conditions and elevated at 400° C. is only $1.1\times10^{-3}/°C$. e.g., as compared with $3.1\times10^{-3}/°$ C. for the dispersed calcium fluoride additive-modified but other wise same composition matrix material when tested under the same conditions. This represents an increase of about 280% in the merit factor for the calcium fluoride modified over the iron silicide modified lead-tellurium material of the same composition.

Similarly, significant increases in the merit factors of p and n type lead-tellurium composition matrix materials of this invention are obtained by dispersing refractory elements, compounds and combinations of elements and compounds, described herein are used to meet the prescribed particle size and interparticle spacing conditions, ratios of the melting points of the dispersants to the melting points of the matrices, deviation in percent of cubic thermal expansion, and low solubility of the dispersants in the martix criteria.

Various methods are used for producing the modified thermoelectric materials of this invention. In general, powder metallurgy and ceramic fabrication methods are employed. Such methods make use of fine particle powders which are compacted into final or intermediate shapes at elevated pressures and temperatures. Fine particle powders of rounded or near spherical shapes are preferred, but irregularly shaped powder particles are satisfactory. Pressure forming, as by mechanical dies, hydrostatic compaction and hot or cold extrusion followed by sintering may be used. Hot-pressing is also used, if care is taken to carry out the operation at temperatures and under protective atmospheres that will not damage the thermoelectric matrix material through harmful phase changes, melting, or loss of components through oxidation and evaporation. One preferred method of producing the improved thermoelectric units, characterized by homogeneous dispersion is to mechanically blend fine particle powders of predoped p and n type lead-tellurium thermoelectric matrix materials with the proper proportions of an insoluble dispersant. Such blended powder is then charged into a metal die where it is compacted to a minimum of 60% of theoretical density (for any given composition) under pressures ranging from 0.25 to 200 tons per square inch. For materials and devices that will be used at low (less than 400° C.) temperatures, the compacted powder blend can be formed directly into a unit to which are attached electrical and thermal leads, such as elements 4 and 5 of FIGURE 2. The same procedure can also be used for high (greater than 400° C.) temperature units, but it is often more practical to attach high temperature leads in a separate action, as by spot welding or brazing.

Sintering of the compacted elements using temperatures as high as 95% of the melting point of the matrix material improves the physical properties of the compact. In many cases, it is advantageous to attach the electrical and thermal leads to the compacted thermoelectric element during this sintering step.

High-temperature plasma spraying equipment is useful to produce modified lead-tellurium thermoelectric units like element 20 of FIGURE 1 and elements 10 and 11 of FIGURE 2, having microstructures like that of FIGURE 3.

The percent cubic thermal expansion and deviation (over the range of 0° C. to 400° C.) for the above matrix and dispersants are shown below together with the merit factors.

| | Percent at 400° C. | Deviation, percent | $Z\times10^{-3}$ |
|---|---|---|---|
| Pb-Te | 1.899 | 0 | |
| $CaF_2$ | 2.70 | 0.81 | p=3.1 |
| FeSi | 1.71 | 0.18 | p=1.1 |

*Example 3*

Specifically, when a lead-tellurium powdered matrix material is mechanically blended with 3 mole percent of manganese and the mixture hot-extruded at 300° C. and 20 tons per square inch, thermoelectric elements are produced which exhibit Z factors of about $3.6\times10^{-3}/°$ C. at 450° C., as indicated in FIGURE 5. The same matrix material, with magnesium oxide dispersant added, yields elements with merit factors of less than $1.0\times10^{-3}/°$ C. at 450° C., as indicated in FIGURE 5. Thus, an increase of 260% in the Z factor results in this case through the use of manganese homogeneously dispersed through a matrix (element 32 of FIGURE 3) of sodium doped p type lead (50 mole percent)-tellurium (50 mole percent) and aluminum doped n type lead (50 mole percent)-tellurium (50 mole percent). The average spacing (element 30 of FIGURE 3) between particles of the dispersant in both matrices is 1000 A. and the particles of dispersant (element 31 of FIGURE 3) range in size from 50 A. to 200,000 A.

When a thermoelectric cooling unit for use at elevated temperature and consisting of the above materials, equipped with junctions and leads such as elements 21 and 22 of FIGURE 1, is connected in series with a power source, element 23 of FIGURE 1, the temperature difference between the hot and cold junctions, which is indicative of the cooling and heating capacities for the modified thermoelectric material of this invention is about 150% greater than for the case of the otherwise modified material.

Similarly, beneficial effects are attained when .001 mole percent to 29 mole percent of elements, compounds and combinations of elements and compounds, described herein, are employed within the limits of particle size, interparticle spacing, melting point, deviation in percent of cubic thermal expansion, and solubility criteria specified for p and n type lead-tellurium matrix materials.

The percent cubic thermal expansion and the deviations between the matrix and dispersants (over 0° C. to 450° C. range) are shown below together with the merit factors.

| | Percent at 0-450° C. | Deviation, percent | $Z\times10^{-3}$ |
|---|---|---|---|
| Pb-Te | 2.25 | 0 | |
| Mn | 3.18 | 0.93 | 3.6 |
| MgO | 1.95 | 0.30 | 1.0 |

When thermoelectric elements are to be used over a large temperature differential, it is important to provide such elements with a gradation in properties along the path of energy flow and particularly heat flow through such elements.

Whether for cooling, heating or power generation, heat flow occurs from the hot zone to the cold zone through composite elements or legs 10 and 11 of FIGURE 2. For a case when a device of the configuration of FIGURE 2 is used to generate power, elements 10 (as shown) consist of 3 segments; elements 1, 2, and 3. For high efficiency of energy conversion, element 1 should have about the same merit factor as elements 2 and 3. Likewise, element 6 of leg 11 has about the same merit factor as elements 7 and 8. For the case at hand, element 10 consists of a n type material while the polarity of element 11 is p type. Element 5 of FIGURE 2 is in electrical and thermal contact between legs 10 and 11 and the energy source, or hot zone. Element 4 serves as electrical and thermal contact for the cold side of the thermoelectric unit of FIGURE 2.

A superior generator is obtained when elements 10 and 11, consisting, respectively, of n and p type lead-tellurium matrix materials are mechanically strengthened and thermoelectrically improved by dispersions of a calcium fluoride additive. The thermoelectric elements for this generator unit, similar in construction to that shown in FIGURE 2, are produced as follows:

Mechanical blends of fine particle (500 A. to 450,000 A.) of n type lead-tellurium modified with fine particle calcium fluoride (100 A. to 350,000 A.) are produced. The blend for element 1 consists of a mixture of a nominal 15 mole percent calcium fluoride in n type lead-tellurium. This powder blend is poured into the bottom of a boron nitride lined carbon mold, or compaction die, large enough to hold the powder change for elements 1, 2 and 3. Next a powder blend of nominal 9 mole percent calcium fluoride in the n type type lead-tellurium matrix (for element 2) is added on top of the 15 mole percent calcium fluoride in lead-tellurium mix in the compaction die. Following this, a powder blend of a nominal 4 mole percent of calcium fluoride in the n type lead-tellurium is placed on top of the loose powder for element 2. The molecular ratio of elements 1:2:3 of leg 10 is approximately 0.5:1.5:1, respectively, for this example. Other element molecular ratios for n type legs may be employed. Next, the compaction die is equipped with a male top and bottom ram to form a powder metallurgy hot-press type compaction-die assembly. This die assembly is then centered in an induction heating coil and the male rams connected with a means for applying pressure to them. A protective atmosphere of argon is provided for the die assembly and pressure equivalent to 3000 p.s.i. exerted on the loose powder. Upon heating to 700° C. under the above pressure, compaction is completed in 5 minutes to produce a segmented type element or leg 10 of about 99% of theoretical density for the segments.

Element or leg 11 is produced in a similar manner from a matrix of p type lead-tellurium (500 A. to 450,000 A.) modified by dispersed calcium fluoride powder (100 A. to 350,000 A.) The same molecular percents of calcium fluoride used for elements 1, 2 and 3 are blended with the matrix material to produce elements 6, 7 and 8 of leg 11. The same die materials, as well as compaction temperatures, pressures and other procedures are also used. The molecular ratios of elements 6, 7 and 8 to each are 0.5:1.5:1, respectively.

The hot electrical and thermal element 5 of the thermoelectric module shown in FIGURE 2 is attached to legs 10 and 11 by simultaneously bonding to element 5 during consolidation at the thermoelectric materials. Element 5, in this particular example consists of nickel while element 4 is commercial copper. Element 4 is attached to the thermoelectric legs by the same technique.

Overall merit factors of $3.5\times10^{-3}/°$ C. and $$3.4\times10^{-3}/° \text{ C.}$$

at 500° C. hot junction temperature are obtained from segment type legs 10 and 11, respectively, when such legs consisting of segments or elements 1, 2, 3, 6, 7 and 8 are produced from the said matrix thermoelectric materials modified by homogeneous dispersions of the said refractory materials. By comparison, the merit factors are $1.4\times10^{-3}/°$ C. and $1.3\times10^{-3}/°$ C., respectively, for legs 10 and 11 comprised of the same composition matrix materials modified with the same mole percent magnesium oxide, and operating over this same temperature range. Thus improvements of approximately 150% and 162% are obtained for matrices of n and p type lead-tellurium, respectively, by the compositions, process and configurations of this example.

Similar improvements of the merit factors for various lead-tellurium matrix compositions are obtained through practice of the technique of providing thermoelectric legs comprised of thermoelectric segments of different concentrations of dispersants of refractory particles. While only one refractory dispersant is used in a single thermoelectric matrix per leg in this example, each segment may be readily made of different dispersants. Other concentrations of dispersants than those described in this example can be used if the concentrations of such dispersants are maintained within the 0.001 mole percent to 29 mole percent range specified in this application. With regard to protective atmospheres used during fabrication, nitrogen, helium and even air can be used. Other electrically and thermally conductive metals may be substituted for nickel and copper as elements 4 and 5 of the typical device shown in FIGURE 2.

The percent cubic thermal expansion and the arithmetic deviation between the matrix and the dispersants (over the range of 0° C. to 500° C.) of Examples 4 and 5 are shown below together with the merit factors.

| | Percent at 800° C. | Deviation percent |
|---|---|---|
| Pb-Te | 2.46 | 0 |
| $CaF_2$ | 3.48 | 1.02 |
| MgO | 2.40 | 0.06 |

| | Merit Factors (Z×10$^{-3}$ | |
|---|---|---|
| | Segmented, Example 4 | Gradated, Example 5 |
| Pb-Te | | |
| $CaF_2$ | n=3.5<br>p=3.4 | =3.8<br>=3.7 |
| MgO | n=1.4<br>p=1.3 | =1.4<br>=1.3 |

*Example 5*

A process similar to that used in Example 4 is employed to fabricate elements 10 and 11 of FIGURE 2 to yield legs in which the thermoelectric properties of a single matrix are smoothly varied to produce legs which operate with higher merit factors over the same temperature drop than legs of constant or uniform composition. For example, continuously varied or gradated composition type legs 10 and 11 for the device shown in FIGURE 2 of this example are produced by feeding a continuously changing composition of modified lead-tellurium constituents into a compaction die. In this manner, the lower portion of element 1 which is to be joined to element 5 of FIGURE 2 is comprised of 10 mole percent mixture of calcium fluoride with n type lead-tellurium. The composition of the succeeding layers of blended powder fed into the compaction die, to form element 1 is gradually decreased in calcium fluoride content until at the junction of elements 1 and 2 of FIGURE 2 the composition reaches 6 mole percent calcium fluoride to yield an average composition for element 1 of about 8 mole percent. The dispersed calcium fluoride content is then continuously decreased with increasing layers of powder charged into the die to form elements 2 and 3 with smoothly gradated composition which average 4 mole percent and 1 mole percent calcium fluoride, respectively. The approximate molecular ratios of elements 1, 2 and 3 of leg 10 are 0.5:1.5:1, as used in Example 4. Following charging of the powder to the die assembly in this way, compaction by pressure and elevated temperature proceeds as previously described in Example 4. Elements 6, 7 and 8 of leg 11 are made in the same manner as are elements 1, 2 and 3 of leg 10. Merit factors of $3.8\times10^{-3}/°$ C. and $3.7\times10^{-3}/°$ C. respectively, are produced for legs 10 and 11 in a typical device configuration shown in FIGURE 2 using the smoothly gradated type elements of this example with the units of the type shown in FIGURE 2. By comparison, merit factors of $1.4\times10^{-3}/°$ C. and $1.3\times10^{-3}/°$ C. are obtained for elements 10 and 11, respectively, comprised of the same n and p type lead-tellurium thermoelectric components made with magnesium oxide dispersions.

In accordance with known device technology, advantage can be taken of the improved merit factor possible with such smoothly gradated thermoelectric legs to produce more highly efficient power generating and high temperature heating-cooling units by either cascading or segmenting typical n and p legs 10 and 11 described in Examples 4 and 5 with thermoelectric materials capable of more efficient operation in temperature ranges beyond the scope of the lead-tellurium matrix materials of this invention.

Similar improvements of merit factors for other matrix thermoelectric materials are obtained when smoothly gradated concentrations of dispersants are used to provide thermoelectric legs of gradated thermoelectric properties by the processes used in this example.

*Example 6*

A specific example of typical results in producing superior thermoelectric materials and devices, through the inducement of strain at elevated temperatures into the lattice of the thermoelectric matrix material, so as to beneficially decrease the product of the electrical resistivity and thermal conductivity of such materials through dispersion of refractory phase with suitably deviating percent of thermal expansion relative to the percent of thermal expansion of matrix materials, is shown by comparing the merit factor obtained for a lead-tellurium thermoelectric matrix material (characterized by 2.46% cubic thermal expansion from 0° C. to 500° C.) with 12 mole percent of calcium fluoride (characterized by a 3.48% expansion from 0° C. to 500° C.) dispersed in it to the merit factor for the same composition lead-tellurium matrix in which 12 mole percent of uranium silicide (characterized by a 2.37% expansion from 0° C. to 500° C.) is used as the dispersed phase. Individual thermoelectric elements, such as element 20 of FIGURE 1, produced under identical pressure conditions and by incorporating the above quantities of calcium fluoride and uranium silicide in an identical matrix material when each of the individual thermoelectric elements is attached with proper leads (elements 21 and 22 of FIGURE 1) to a measuring circuit 23, exhibit different merit factors when operated over the same temperature drop. Specifically, a merit factor of $3.4\times10^{-3}/°$ C. at 500° C. is obtained for the thermoelectric lead-tellurium matrix material in which 12 mole percent calcium fluoride is homogeneously dispersed prior to hot pressing at 675° C. and 35,000 p.s.i. By comparison, an identical lead-tellurium matrix composition in which 12 mole percent uranium silicide is homogeneously dispersed prior to compacting into a test piece under identical temperatures and pressure fabrication conditions, as well as being fabricated with identical thermal and electrical contacts, exhibits a merit factor less than $1\times10^{-3}/°$ C. at 500° C.

The decrease in the merit factor for the matrix material modified with uranium silicide as compared with the one in which calcium fluoride is dispersed is larger than could be accounted for by the relative thermal and electrical conductivities of the dispersants. The results obtained are more in line with the relative degree of matrix lattice strain that is estimated from the deviation of the percent cubic thermal expansion between that of the matrix and that of each dispersant used. That is, the thermoelectric properties of the matrix material are enhanced at high temperature when the percent of thermal expansion of the dispersant deviates within the described limits from that for the matrix material, with greater deviation dispersants yielding the greatest benefit to thermoelectric materials for use at elevated temperatures.

Their beneficial effects are obtained with p and n type matrices of the present invention.

Use of dispersed phases of higher expansion coefficients than those of lead-tellurium matrices permits employment of high-temperature flame and plasma spray apparatus to economically produce large area (high power) thermoelectric units in a variety of geometries and without the use of high forming pressures. Costly dies and die-heating apparatus are minimized as proper selection of the dispersed phase creates the beneficial lattice stress and strain effect desired.

The percent cubic thermal expansion and the deviations between the matrix and the dispersant (over the range of 0° C. to 500° C.) are shown below together with the merit factors.

| | Percent at 0–500° C. | Deviation, percent | $Z\times10^{-3}$ |
|---|---|---|---|
| Pb-Te | 2.46 | 0 | ---------- |
| $CaF_2$ | 3.48 | 1.02 | 3.4 |
| USi | 2.37 | 0.09 | 1.0 |

*Example 7*

A specific example of the power producing characteristics of devices made in accordance with the present invention is shown when a simple thermoelectric device consisting of a boron nitride modified matrix unit as described in Example 1 is equipped with electrical and thermal contacts, elements 21 and 22 of FIGURE 1 and connected to a matched resistance load and power meter. When an energy source is used to heat the hot junction of this unit to 500° C. and a calorimetric heat sink provided to cool the cold junction of this unit to 75° C., 0.4 watt of electrical power output are produced for a heat power input of 14.6 B.t.u. per hour. By comparison, the power output of a magnesium oxide modified matrix unit of the same cross sectional area of Example 1 is only 0.2 watt for the same heat power input. The advantage of the boron nitride modified matrix material over the magnesium oxide modified is a significant 100% increase in power generation capability, under the same temperature or thermal flux conditions.

The percent cubic thermal expansion and the devitations between the matrix and the dispersant (over the range of 0° C. to 500° C.) are shown below together with the merit factors.

| | Percent at 300° C. | Deviation, percent | $Z\times10^{-3}$ |
|---|---|---|---|
| Pb-Te | 1.41 | 0 | ---------- |
| BN | 0.63 | 0.78 | n=3.1<br>p=3.0 |
| MgO | 1.32 | 0.09 | n=1.3<br>p=1.2 |

*Example 8*

As shown in FIGURE 6, thermoelectric matrices modified through the use of insoluble dispersants show significantly less degradation with time when exposed to elevated temperatures than matrices of the same composition without dispersants. For example, when n and p type lead-tellurium (50–50) matrix materials are modified with 11 mole percent boron carbide to produce n and p type thermoelectric units, such as shown in FIGURE 1, little or no degradation (as noted by change in merit factor) is noted after 300 hours operation of such units at 500° C. On the other hand, the merit factor of units of the same geometry, thermal and electrical contacts and with the same n and p type lead-tellurium matrix compositions decrease appreciably (about 30%) when operated at the same temperature for the same length of time. Such increased stability of merit factors is quite valuable for applications in space or remote regions on earth where it is desirable for thermoelectric generators to operate for extended periods with no attention or maintenance.

The percent cubic thermal expansion and the deviations between the matrix and the dispersants (0° C. to 500° C.) are shown below together with the merit factors.

| | Percent at 0-500° C. | Deviation, percent |
|---|---|---|
| Pb-Te | 2.46 | 0 |
| $B_4C$ | 0.96 | 1.50 |

*Example 9*

A matrix of bismuth (20 mole percent) antimony (20 mole percent) telleurium (60 mole percent) as a p type matrix is prepared so that the approximate average interparticle spacing between the modifying calcium fluoride particles in this matrix is 280 A. after compacting at 350° C. and 1000 p.s.i. The Z factor of the unmodified bismuth (20 mole percent) antimony (20 mole percent) tellurium (60 mole percent) matrix materials is $2.5\times10^{-3}/°$ C. at about 27° C. The Z factor for the modified bismuth-antimony-tellurium matrix with dispersed calcium fluoride is $4.1\times10^{-3}/°$ C. at about 27° C. or about 156% higher than the Z factor for the unmodified specimen of the same composition for the same operating temperatures as indicated in FIGURE 4. The merit factor for a complementary n type bismuth (40 mole percent)-tellurium (48 mole percent) with 12 mole percent selenium is similarly increased from $2.5\times10^{-3}/°$ C. to $5.1\times10^{-3}/°$ C. by fabricating elements in which 3 mole percent of the same size calcium fluoride particles are homogeneously dispersed.

The arithmetical deviation of the percent cubic thermal expansion of the above matrix materials and the dispersant (−100° C. to 500° C. and especially in the range of −100° C. to 27° C.) are summarized below together with the merit factors.

| | $CaF_2$ p-type matrix | $CaF_2$ n-type matrix |
|---|---|---|
| Percent of cubic thermal expansion: | | |
| Of dispersant | 2.16 | 2.16 |
| Of matrix | 1.41 | 1.41 |
| Devia ion | 0.75 | 0.75 |
| Z, merit factor | $4.1\times10^{-3}$ | $5.1\times10^{-3}$ |

We claim:

1. As an article of manufacture, a shaped, semiconductor lead-tellurium two-phase body comprising a matrix of consolidated lead and tellurium in the proportion of between 43 mole percent to 54 mole percent lead, and 57 mole percent to 46 mole percent tellurium, the said matrix having uniformly dispersed therein a particulate material selected from the group consisting of the oxides of magnesium, aluminum, zirconium, beryllium, chromium, hafnium, vanadium; the nitrides of boron and rare earth elements of lanthanide and actinide series; the sulphides of the rare earth elements of lanthanide and actinide series; the phosphides of boron, aluminum; the carbides of boron, silicon, magnesium, titanium; the silicides of carbon; the fluorides of calcium, magnesium, sodium; the said dispersant being present in the range of from 0.001 mole percent to 29 mole percent of the matrix, and having an absolute melting point of at least 105% of the melting point of the said matrix material, the said dispersant also having a solubility in the matrix of less than 10 mole percent at a temperature which is 60% of the absolute melting point of the matrix, the said dispersant also being characterized by a percent cubic thermal expansion which differs arithmetically from that of the matrix by a deviation of from 0.50% to 2.00% over the range of 0° C. to 500° C.

2. A thermoelectric unit comprising at least one shaped, semiconductor two-phase body, and electrical leads at opposed portions of the said body, the said body comprising a matrix of a combination of between 43 mole percent to 54 mole percent of lead, and 57 mole percent to 46 mole percent of tellurium, and having dispersed within the said matrix, particles of boron nitride present at from 0.001 mole percent to 29 mole percent of the matrix, the said boron nitride dispersant being characterized by a solubility in the matrix of less than 10 mole percent at a temperature which is 60% of the absolute melting point of the matrix, and a percent cubic thermal expansion which differs arithmetically from that of the matrix by a deviation of from 0.50% to 2.00% over the range of from 0° C. to 500° C.

3. A thermoelectric unit comprising at least one shaped, semiconductor two-phase body, and electrical leads at opposed portions of the said body, the said body comprising a matrix of a combination of between 43 mole percent to 54 mole percent of lead, and 57 mole percent to 46 mole percent of tellurium and having dispersed within the said matrix, particles of calcium fluoride present at from 0.001 mole percent to 29 mole percent of the matrix, the said calcium fluoride dispersant being characterized by a solubility in the matrix of less than 10 mole percent at a temperature which is 60% of the absolute melting point of the matrix, and a percent cubic thermal expansion which differs arithmetically from that of the matrix by a deviation of from 0.50% to 2.00% over the range of from 0° C. to 500° C.

4. A thermoelectric unit comprising at least one shaped, semiconductor two-phase body, and electrical leads at opposite portions of the said body, the said body comprising a matrix of a combination of between 43 mole percent to 54 mole percent of lead, and 57 mole percent to 46 mole percent tellurium and having dispersed within the said matrix, particles of manganese present at from 0.001 mole percent to 29 mole percent of the matrix, the said manganese dispersant being characterized by a solubility in the matrix of less than 10 mole percent at a temperature which is 60% of the absolute melting point of the matrix, and a percent cubic thermal expansion which differs arithmetically from that of the matrix by a deviation of from 0.50% to 2.00% over the range of from 0° C. to 500° C.

5. A thermoelectric unit comprising at least one shaped, semiconductor two-phase body, and electrical leads at opposite portions of the said body, the said body comprising a matrix of a combination of between 43 mole percent to 54 mole percent of lead, and 57 mole percent to 46 mole percent tellurium and having dispersed within the said matrix, particles of boron carbide, $B_4C$, present at from 0.001 mole percent to 29 mole percent of the matrix, the said boron carbide dispersant being characterized by a solubility in the matrix of less than 10 mole percent at a temperature which is 60% of the absolute melting point of the matrix, and a percent cubic thermal expansion which differs arithmetically from that of the matrix by a deviation of from 0.50% to 2.00% over the range of from 0° C. to 500° C.

6. A thermoelectric unit comprising at least one shaped, semiconductor two-phase body, and electrical leads at opposed portions of the said body, the said body comprising a matrix of a combination of between 43 mole percent to 54 mole percent of lead and 57 mole percent to 46 mole percent of selenium and having dispersed within the said matrix, particles of calcium fluoride present at from 0.001 mole percent to 29 mole percent of the matrix, with the said calcium fluoride dispersant being characterized by a percent cubic thermal expansion which differs arithmetically from that of the matrix by a deviation of from 0.5% to 2.00% over the range of from 0° C. to 500° C.

7. A thermoelectric unit comprising at least one shaped, semiconductor two-phase body, and electrical leads at opposed portions of the said body, the said body comprising a matrix of a combination of between 43 mole percent to 54 mole percent of lead and 57 mole percent to 46 mole percent of tellurium, and having dispersed within the said matrix, particles of calcium fluoride present at from 0.001 mole percent to 29 mole percent of the matrix, the said calcium fluoride dispersant also being characterized by a percent cubic thermal expansion which differs arithmetically from that of the matrix by a deviation of from 0.5% to 2.00% over the range of from 0° C. to 500° C., the proportion of the said dispersant differing in one region of the said body from the proportion thereof at another region of the said body.

8. A thermoelectric unit comprising at least one shaped, semiconductor two-phase body, and electrical leads at opposed portions of the said body, the said body comprising a matrix of consolidated lead and tellurium in the proportion of between 43 mole percent to 54 mole percent lead, and 57 mole percent to 46 mole percent tellurium, the said matrix having uniformly dispersed therein a particulate material selected from the group consisting of the oxides of magnesium, aluminum, zirconium, beryllium, chromium, hafnium, vanadium; the nitrides of boron and the rare earth elements of lanthanide and actinide series; the sulphides of the rare earth elements of the lanthanide and actinide series; the phosphides of boron and aluminum; the carbides of boron, silicon, magnesium, titanium; the silicides of carbon; the fluorides of calcium, magnesium, sodium; the said dispersant being present in the range of from 0.001 mole percent to 29 mole percent of the matrix, and having an absolute melting point of at least 105% of the melting point of the said matrix material, the said dispersant also having a solubility in the matrix of less than 10 mole percent at a temperature which is 60% of the absolute melting point of the matrix, the said dispersant also being characterized by a percent cubic thermal expansion which differs arithmetically from that of the matrix by a deviation of from 0.50% to 2.00% over the range of from 0° C. to 500° C.

9. A thermoelectric unit as described in claim 8 in which there is a gradation in concentration of the dispersed particulate additive material from the respective opposed regions to be subjected to heat and to cold.

10. Process for converting heat into electricity which comprises applying heat to a hot junction element in physical and electrical contact with a first leg, of p-type conductivity, and a second leg of n-type conductivity, said legs and hot junction elements forming a first thermoelectric junction, at least one of said legs being comprised of a matrix of consolidated lead and tellurium in the proportion of between 43 mole percent to 54 mole percent lead and 57 mole percent to 46 mole percent tellurium, the said matrix having uniformly dispersed therein a particulate material selected from the group consisting of the oxides of magnesium, aluminum, zirconium, beryllium, chromium, hafnium, vanadium; the nitrides of boron and the rare earth elements of the lanthanide and actinide series; the sulphides of the rare earth elements of the lanthanide and actinide series; the phosphides of boron and aluminum; the carbides of boron, silicon, magnesium, titanium; the silicides of carbon; the fluorides of calcium, magnesium, sodium; the said dispersant being present in the range of from 0.001 mole percent to 29 mole percent of the matrix, and having an absolute melting point of at least 105% of the melting point of the said matrix material, the said dispersant also having a solubility in the matrix of less than 10 mole percent at a temperature which is 60% of the absolute melting point of the matrix, the said dispersant also being characterized by a percent cubic thermal expansion which differs arithmetically from that of the matrix by a deviation of from 0.50% to 2.00% over the range of from 0° C. to 500° C. cooling the cold junction element in physical and electrical contact with said first and second legs, remote from the said hot junction and forming a second thermoelectric junction, and withdrawing electricity from said cold junction.

11. Process for converting heat into electricity which comprises applying heat to a hot junction element in physical and electrical contact with a first leg, a p-type conductivity, and a second leg of n-type conductivity, said legs and hot junction element forming a first thermoelectric junction, at least one of said legs being comprised of a matrix combination of a first member selected from the group consisting of lead and bismuth, with a second member selected from the group consisting of tellurium, selenium, antimony and combinations thereof in the proportion of between 20 mole percent to 54 mole percent of the first member and 80 mole percent to 46 mole percent of the said second member, the said matrix having uniformly dispersed therein a particulate material selected from the group consisting of the oxides of magnesium, aluminum, zirconium, beryllium, chromium, hafnium, vanadium; the nitrides of boron and the rare earth elements of the lanthanide and actinide series; the sulphides of the rare earth elements of the lanthanide and actinide series; the phosphides of boron and aluminum; the carbides of boron, silicon, magnesium, titanium; the silicides of carbon; the fluorides of calcium, magnesium, sodium; the said dispersant being present in the range of from 0.001 mole percent to 29 mole percent of the matrix, and having an absolute melting point of at least 105% of the melting point of the said matrix material, the said dispersant also having a solubility in the matrix of less than 10 mole percent at a temperature which is 60% of the absolute melting point of the matrix, the said dispersant also being characterized by a percent cubic thermal expansion which differs arithmetically from that of the matrix by a deviation of from 0.50% to 2.00% over the range of from −100° C. to 500° C. cooling the cold junction element in physical and electrical contact with said first and second legs, remote from the said hot junction and forming a second thermoelectric junction, and withdrawing electricity from said cold junction.

12. Process for converting heat into electricity which comprises applying heat to a hot junction element in physical and electrical contact with a first leg, a p-type conductivity, and a second leg of n-type conductivity, said legs and hot junction element forming a first thermoelectric junction, at least one of said legs being comprised of a matrix of consolidated lead and tellurium in the proportion of between 45 mole percent to 53 mole percent lead and 55 mole percent to 47 mole percent tellurium, the said matrix having uniformly dispersed therein a particulate material selected from the group consisting of the oxides of magnesium, aluminum, zirconium, beryllium, chromium, hafnium, vanadium; the nitrides of boron and the earth elements of the lanthanide and actinide series; the sulphides of the rare earth elements of the lanthanide and actinide series; the phosphides of boron and aluminum; the carbides of boron, silicon, magnesium, titanium; the silicides of carbon; the fluorides of calcium, magnesium, sodium; the said dispersant being present in the range of from 0.01 mole percent to 20 mole percent of the matrix, and having an absolute melting point of at least 105% of the melting point of the said matrix material, the said dispersant also having a solubility in the matrix of less than 10 mole percent at a temperature which is 60% of the absolute melting point of the matrix, the said dispersant also being characterized by a percent cubic thermal expansion which differs arithmetically from that of the matrix by a deviation of from 0.58% to 2.00% over the range of from 0° C. to 500° C. cooling the cold junction element in physical and electrical contact with said first and second legs, remote from the said hot junction and forming a second thermoelectric junction, and withdrawing electricity from said cold junction.

13. The process for converting electricity into cooling and heating effects which comprises applying electricity to a cold junction element in physical and electrical contact with a first leg of p-type conductivity, and a second leg of n-type conductivity, said legs, and cold junction elements forming a first thermoelectric junction and said legs and a hot junction forming a second thermoelectric junction, at least one of said legs being comprised of a matrix of consolidated lead and tellurium in the proportion of between 47 mole percent to 52 mole percent lead and 53 mole percent to 48 mole percent tellurium, the said matrix having uniformly dispersed therein a particulate material selected from the group consisting of the oxides of magnesium, aluminum, zirconium, beryllium, chromium, hafnium, vanadium; the nitrides of boron and rare earth elements of the lanthanide and actinide series; the sulphides of the rare earth elements of the lanthanide and actinide series; the phosphides of boron and aluminum; the carbides of boron, silicon, magnesium, titanium; the silicides of carbon; the fluorides of calcium, magnesium, sodium; the said dispersant being present in the range of from 0.1 mole percent to 15 mole percent of the matrix, and having an absolute melting point of at least 105% of the melting point of the said matrix material, the said dispersant also having a solubility in the matrix of less than 10 mole percent at a temperature which is 60% of the absolute melting point of the matrix, the said dispersant also being characterized by a percent cubic thermal expansion which differs arithmetically from that of the matrix by a deviation of from 0.67% to 2.00% over the range of from 0° C. to 500° C., thereby cooling the cold junction element in physical and electrical contact with said first and second legs, remote from the said hot junction and forming a second thermoelectric junction, and cooling the said cold junction.

References Cited by the Examiner

UNITED STATES PATENTS

| | | | |
|---|---|---|---|
| 775,188 | 11/1904 | Lyons et al. | 136—5.4 |
| 885,430 | 4/1908 | Bristol | 136—5.4 |
| 1,019,390 | 3/1912 | Weintraub | 23—209 |
| 1,075,773 | 10/1913 | Ferra | 136—5.5 |
| 1,079,621 | 11/1913 | Weintraub | 136—5 |
| 1,127,424 | 2/1915 | Ferra | 136—5.4 |
| 2,811,441 | 10/1957 | Fritts et al. | 75—166 |
| 2,811,571 | 10/1957 | Fritts et al. | 136—5 |
| 2,955,145 | 10/1960 | Schrewelius | 136—5 |
| 2,990,439 | 6/1961 | Goldsmid et al. | 136—5 |
| 3,051,767 | 8/1962 | Frederick et al. | 136—5 |
| 3,081,361 | 3/1963 | Henderson et al. | 136—4 |
| 3,081,362 | 3/1963 | Henderson et al. | 136—4 |
| 3,081,363 | 3/1963 | Henderson et al. | 136—4 |
| 3,081,364 | 3/1963 | Henderson et al. | 136—4 |
| 3,081,365 | 3/1963 | Henderson et al. | 136—4 |
| 3,095,330 | 6/1963 | Epstein et al. | 136—5 |

OTHER REFERENCES

"Condensed Chemical Dictionary," 6th edition, Reinhold Publishing Company, New York.

Fuschillo, N., "Proc. Phys. Soc. (London)," (1952).

"Handbook of Chemistry and Physics," 35th edition, Chemical Rubber Pub. Co., Cleveland, Ohio (1953), p. 595.

Hansen, M., "Constitution of Binary Alloys," 2nd edition, McGraw-Hill Book Co., Inc., N.Y., 1958, p. 1111.

WINSTON A. DOUGLAS, *Primary Examiner.*

JOHN H. MACK, *Examiner.*

A. M. BEKELMAN, *Assistant Examiner.*

UNITED STATES PATENT OFFICE

CERTIFICATE OF CORRECTION

Patent No. 3,285,019 November 15, 1966

Courtland M. Henderson et al.

It is certified that error appears in the above identified patent and that said Letters Patent are hereby corrected as shown below:

Column 3, line 41, cancel "7"; line 69, "inclusion" should read -- inclusions --. Column 4, line 9, after "electrons" insert a comma. Column 6, lines 37, 42, 43 and 50, "percent", each occurrence, should read -- percent) --; line 73, "teaching' should read -- teachings --. Column 7, line 12, "other wise" should read -- otherwise --. Column 8, first table, second column, line 1 thereof, "1.899" should read -- 1.89 --; same column, second table, second column, line 2 thereof, ".3.18" should read -- 3.18 --. Column 10, in the heading to the table, second column thereof, "800° C." should read -- 0-500° C --. Column 11, line 43, "pressure" should read -- pressing --. Column 16, lines 10 and 47, "a p-type", each occurrence, should read -- of p-type --.

Signed and sealed this 25th day of November 1969.

(SEAL)
Attest:

EDWARD M.FLETCHER,JR.
Attesting Officer

WILLIAM E. SCHUYLER, JR.
Commissioner of Patents